United States Patent
Koyama (10) Patent No.: US 8,035,710 B2
(45) Date of Patent: Oct. 11, 2011

(54) SOLID-STATE IMAGING DEVICE AND SIGNAL PROCESSING METHOD

(75) Inventor: Shinzo Koyama, Osaka (JP)

(73) Assignee: Panasonic Corporation, Osaka (JP)

( * ) Notice: Subject to any disclaimer, the term of this patent is extended or adjusted under 35 U.S.C. 154(b) by 771 days.

(21) Appl. No.: 12/134,261

(22) Filed: Jun. 6, 2008

(65) Prior Publication Data

US 2008/0304156 A1 Dec. 11, 2008

(30) Foreign Application Priority Data

Jun. 8, 2007 (JP) ................. 2007-153289

(51) Int. Cl.
 *H04N 5/335* (2006.01)
 *H04N 5/225* (2006.01)
 *H01L 31/062* (2006.01)
 *H01L 31/232* (2006.01)

(52) U.S. Cl. ........ 348/273; 348/340; 257/290; 257/292; 257/294; 257/432

(58) Field of Classification Search ................... 348/273, 348/340; 257/290, 292, 294, 432
See application file for complete search history.

(56) References Cited

U.S. PATENT DOCUMENTS

| | | | |
|---|---|---|---|
| 3,971,065 A | 7/1976 | Bayer | |
| 7,623,166 B2 * | 11/2009 | Inaba et al. | 348/273 |
| 7,701,024 B2 * | 4/2010 | Kasano et al. | 257/432 |
| 7,759,679 B2 * | 7/2010 | Inaba et al. | 257/59 |
| 2006/0012808 A1 | 1/2006 | Mizukura et al. | |
| 2006/0285005 A1 * | 12/2006 | Inaba et al. | 348/340 |
| 2008/0024638 A1 | 1/2008 | Murakami | |
| 2008/0061216 A1 | 3/2008 | Kasuga et al. | |
| 2008/0074527 A1 | 3/2008 | Kato | |
| 2008/0143829 A1 | 6/2008 | Takeda | |
| 2008/0170143 A1 | 7/2008 | Yoshida | |

FOREIGN PATENT DOCUMENTS

| | | |
|---|---|---|
| JP | 2003-284084 | 10/2003 |
| JP | 2005-101109 | 4/2005 |

OTHER PUBLICATIONS

English language Abstract of JP 2003-284084, Oct. 3, 2003.
English language Abstract of JP 2005-101109, Apr. 14, 2005.

* cited by examiner

*Primary Examiner* — David Ometz
*Assistant Examiner* — Quang Le
(74) *Attorney, Agent, or Firm* — Greenblum & Bernstein, P.L.C.

(57) ABSTRACT

A solid-state imaging device including a color filter having a filter characteristic more approaching to a human visual sensitivity is provided. The color filter including a group of dielectric layers has high-refractive-index-material films and low-refractive-index-material films, the high-refractive-index-material film and the low-refractive-index-material film being n films and (n−1) films, respectively, which are laminated alternately, n being an integer equal to or larger than 4. The color filter includes at least a red-transmission filter, a green-transmission filter, and a blue-transmission filter. The group of dielectric layers is common in the color filter and includes two of the high-refractive-index-material films and one of the low-refractive-index-material films positioned between and in contact with the two of high-refractive-index-material films. In the red-transmission filter, a first one of low-refractive-index-material films and a second one of low-refractive-index-material films, which are not in the group of dielectric layers, have a thickness different from each other.

6 Claims, 13 Drawing Sheets

SOLID-STATE IMAGING DEVICE AND SIGNAL PROCESSING METHOD

BACKGROUND OF THE INVENTION (1) Field of the Invention

The present invention relates to a solid-state imaging device such as a Charge-Coupled Device (CCD) sensor or a Complementary Metal-Oxide Semiconductor (CMOS) sensor and to a method for processing signals outputted from the solid-state imaging device. The present invention particularly relates to a solid-state imaging device provided with a color filter that even enables imaging of a near-infrared light and to a method for processing signals obtained by photoelectric conversion on a light transmitted through the color filter of the solid-state imaging device.

(2) Description of the Related Arts

Solid-state imaging devices conventionally include laminated color filters for transmitting an RGB three-primary-color light (see, for example, Patent Reference 1: U.S. Pat. No. 3,971,065) and enable representation of almost every color.

The conventional color reproduction techniques in which the RGB primary colors are employed, however, have not been sufficient for representing colors as natural as the human eye senses. Particularly, the cyan includes a portion which cannot be represented.

Accordingly, a color filter characteristic has been proposed, which is based on a concept of the XYZ colorimetric system. For the color filter characteristic, it has been taken into consideration that a human optic nerve which senses red has a negative sensitivity to the cyan. Imaging more approaching to the human eye can be achieved by providing a solid-state imaging device with a color filter having such filter characteristic.

It is not possible, however, to obtain the filter characteristic approaching to the characteristic of X of the XYZ calorimetric system simply by superimposing a red-transmission filter and a blue-transmission filter. This is because, when two filters are superimposed, the filter characteristics of the respective filters are included, so that a light is not transmitted through the superimposed filters.

With such a background, a method has been proposed, which implements the negative sensitivity of a red filter by using an emerald filter that transmits only the cyan light which is the subject of the negative sensitivity and by subtracting, from a red signal component, a signal component obtained in a pixel corresponding to the emerald filter (see, for example, Patent Reference 2: Japanese Unexamined Patent Application Publication No. 2003-284084).

Meanwhile, conventional color filters are composed of a pigment or a colorant using organic materials. In the case where these organic materials are used, it is possible to absorb a specific light by utilizing a color separation feature of these organic materials. In this case, the organic materials transmit lights that are not absorbed.

However, a further miniaturized size for a pixel is desired these days as more pixels are included in a light receiving element. This means that the number of electrons to be generated from a received light per pixel of a photodiode has been physically decreased. As described above, when the number of electrons to be generated in a pixel decreases due to the miniaturization, the sensitivity of the photodiode to a light further decreases in the case where the color filter includes the organic materials, since the color filter absorbs a portion of the light.

Accordingly, a reflective color filter has been proposed as a color filter that enables color separation without decreasing light transmission (see, for example, Patent Reference 3: Japanese Unexamined Patent Application Publication NO 2005-101109). More specifically, this reflective color filter uses an inorganic dielectric multilayer filter in which a film with a high refractive index and a film with a low refractive index are alternately laminated and which transmits a light having a particular wavelength under a certain film-thickness condition. Use of such multilayer allows a light forbidden band to be produced, in which a light with a certain wavelength range cannot be transmitted. By superimposing films which are different in structure enables transmitting only a light with a specific wavelength. Use of this phenomenon makes possible the implementation of three-type color filters each of which transmits desired three primary colors.

A luminance signal Y is generally expressed by the following expression: $Y=0.11B+0.59G+0.30R$. Here, B, C and R represent a blue signal, a green signal and a red signal, respectively. With regard to this, it is known that, in order to obtain a luminance signal with a large value, use of a pixel arrangement called "Bayer arrangement" in which a unit cell includes four pixels of R, G, G, and B enables the most efficient obtainment of the luminance signal (see, for example, Patent Reference 1: U.S. Pat. No. 3,971,065). Further, from the above description, use of an emerald pixel in place of one of the G pixels of the RGGB pixel can be considered.

However, when the emerald pixel is used in place of one of the G pixels of the conventional RGGB pixel, the green signals that dominate in the luminance signal are reduced by half, in other words, from two green signals to one green signal. Accordingly, the luminance signal cannot be obtained efficiently. As stated above, among the human visual sensitivity, particularly the visual sensitivity to red has the negative sensitivity to the light of 500 nm wavelength. There has not been a color filter that has such a filter characteristic as the human visual sensitivity has.

SUMMARY OF THE INVENTION

The present invention has been considered in view of the above-described problem and has a first object to provide a solid-state imaging device including a color filter having a filter characteristic more approaching to a human visual sensitivity. Further, the invention has a second object to implement a solid-state imaging device including a color filter having a filter characteristic further approaching to the human visual sensitivity by combining a color filter having the above-described filter characteristics and a signal processing method.

In order to achieve the objects described above, a solid-state imaging device according to the present invention includes a color filter including a group of dielectric layers, the color filter having high-refractive-index-material films and low-refractive-index-material films, the high-refractive-index-material films and the low-refractive-index-material films being n films and (n−1) films, respectively, which are laminated alternately, and n being an integer equal to or larger than 4, wherein the color filter includes at least a red-transmission filter, a green-transmission filter, and a blue-transmission filter, the group of dielectric layers is common to the red-transmission filter, the green-transmission filter, and the blue-transmission filter and includes two of the high-refractive-index-material films and one of the low-refractive-index-material films, the one of low-refractive-index-material films being positioned between and in contact with the two of high-refractive-index-material films, and in the red-transmission filter, a first one of the low-refractive-index-material films and a second one of the low-refractive-index-material films, which are not included in the group of dielectric layers, have a thickness different from each other.

This structure provides the color filter with films laminated at a different pitch. Accordingly, it is possible to utilize the characteristic that a light effectively interferes under a certain film-thickness condition, and lights other than primary colors can also be transmitted. A color filter having X of the XYZ colorimetric system can be implemented by, with use of this characteristic, providing the red filter with a characteristic to transmit a blue light.

Further, in order to achieve the objects described above, a signal processing method according to the present invention uses a signal outputted from a solid-state imaging device, wherein the solid-state imaging device includes: light receiving elements, each of which receives one of a red light, a green light, a blue light, and a near-infrared light; and a color filter having a group of dielectric layers, the color filter having high-refractive-index-material films and low-refractive-index-material films, the high-refractive-index-material films and the low-refractive-index-material films being n films and (n−1) films, respectively, which are laminated alternately, and n being an integer equal to or larger than 4, the color filter including at least a red-transmission filter, a green-transmission filter, a blue-transmission filter, and a near-infrared light transmission filter, the group of dielectric layers being common to the red-transmission filter, the green-transmission filter, the blue-transmission filter, and the near-infrared light transmission filter and including two of the high-refractive-index-material films and one of the low-refractive-index-material films, the one of low-refractive-index-material films being positioned between and in contact with the two of high-refractive-index-material films, and in the red-transmission filter and the near-infrared light transmission filter, a first one of the low-refractive-index-material films and a second one of the low-refractive-index-material films are not included in the group of dielectric layers and have a thickness different from each other, the signal processing method comprising: obtaining a red signal from the light receiving element which has received a red light, a green signal from the light receiving element which has received a green light, blue signal from the light receiving element which has received a blue light, and a near-infrared signal from the light receiving element which has received a near-infrared light; subtracting a signal from each of the red signal, the green signal, and the blue signal, the signal being obtained by multiplying the near-infrared signal by a coefficient predetermined for each of the red signal, the green signal, and the blue signal; and performing a matrix operation using the red signal, the green signal, and the blue signal, on which the subtracting having been performed.

With this structure, it is possible to subtract a signal caused by the near-infrared light received in the visible light region (the red-transmission filter, the green-transmission filter, and the blue-transmission filter, as described above) for obtaining a visible-light image by subtracting the near-infrared light received in the near-infrared light transmission filter from each of the lights received in the visible-light region. Further, it is possible to eliminate the need for a substantial system change since the matrix operation conventionally applied in the three-primary-color system can be used. Consequently, it is possible to change between the visible-light image and the near-infrared image (an image obtained from the near-infrared signal) without the infrared cut filter (hereinafter referred to as IR cut filter). This eliminates the need for a mechanical module such as an IR cut filter changing mechanism, thereby enabling an implementation of an imaging apparatus at low costs.

Note that the present invention can also be implemented as a camera having the solid-state imaging device described above.

The present invention can realize a color filter having a characteristic approaching to that of the color filter of the XYZ calorimetric system, by providing two defect layers of a dielectric multilayer filter and making the thickness of the two defect layers different from each other.

Further, introduction of a near-infrared pixel (hereinafter referred to as IR pixel) makes possible representing color of the XYZ calorimetric system. This reduces the number of component as a camera system, thereby enabling representation of images with high color gamut at low costs.

FURTHER INFORMATION ABOUT TECHNICAL BACKGROUND TO THIS APPLICATION

The disclosure of Japanese Patent Application No. 2007-153289 filed on Jun. 8, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings.

DESCRIPTION OF THE PREFERRED EMBODIMENT(S)

Embodiments according to the present invention will be described below with reference to the drawings. Note that, although the present invention will be described with following embodiments and the drawings, they are intended not for the purpose of limitation but for exemplification only.

First Embodiment

Figure 1:
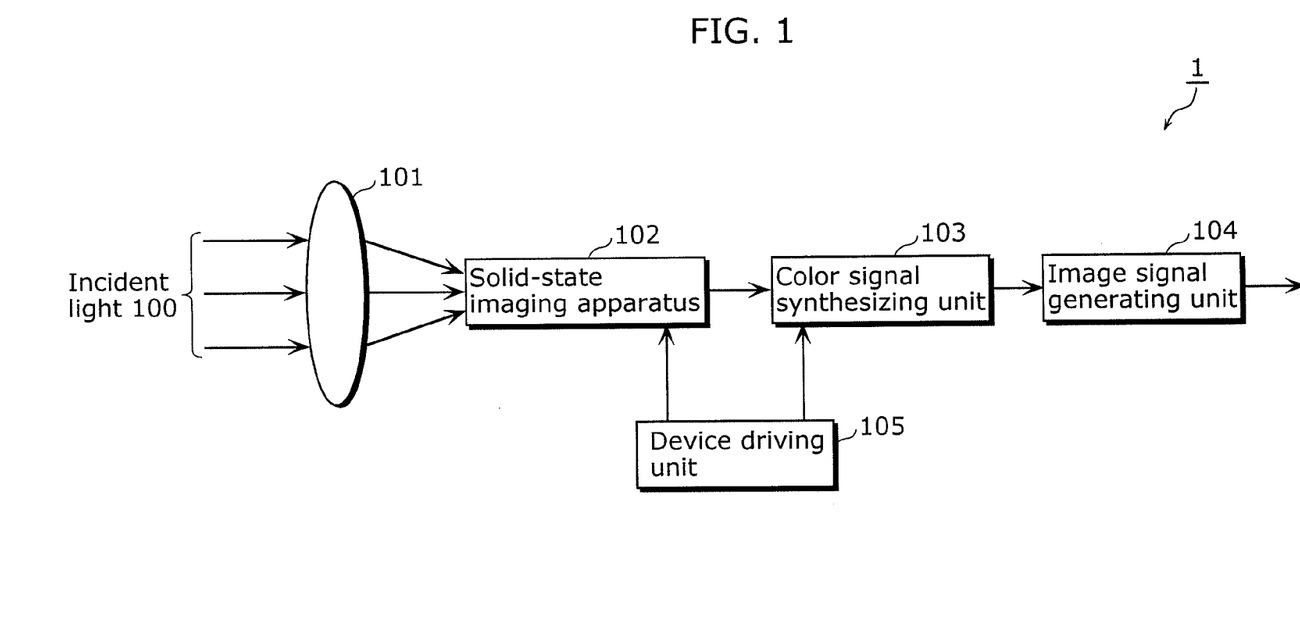
FIG. 1 is a block diagram illustrating a function structure of a digital still camera according to an embodiment of the present invention.

FIG. 1 is a block diagram illustrating a main function structure of a camera 1 (for example, a digital still camera, a mobile phone with a built-in camera, and so on) according to the present invention. As illustrated in FIG. 1, the camera 1 includes a lens 101, a solid-state imaging apparatus 102, a color signal synthesizing unit 103, an image signal generating unit 104 and a device driving unit 105.

The lens 101 is a light-collecting element for use in image formation of a light incident on the camera 1 (incident light 100) on an imaging area of the solid-state imaging apparatus 102. The solid-state imaging apparatus 102, in which solid-state imaging devices (also referred to as "unit pixel" or simply as "pixel") are two-dimensionally arranged, generates a color signal by performing photoelectric conversion on a light collected by the lens 101. The device driving unit 105 is a processing unit that extracts a color signal from each of the solid-state imaging devices in the solid-state imaging apparatus 102. The color signal synthesizing unit 103 is a processing unit that applies color shading on the color signal received from the solid-state imaging apparatus 102. The image signal generating unit 104 is a processing unit that generates a color image signal from the color signal on which the color signal synthesizing unit 103 has applied color shading. Note that the color image signal is ultimately recorded, as color image data, on a recording medium such as a Random Access Memory (RAM) or a memory card.

Figure 2:
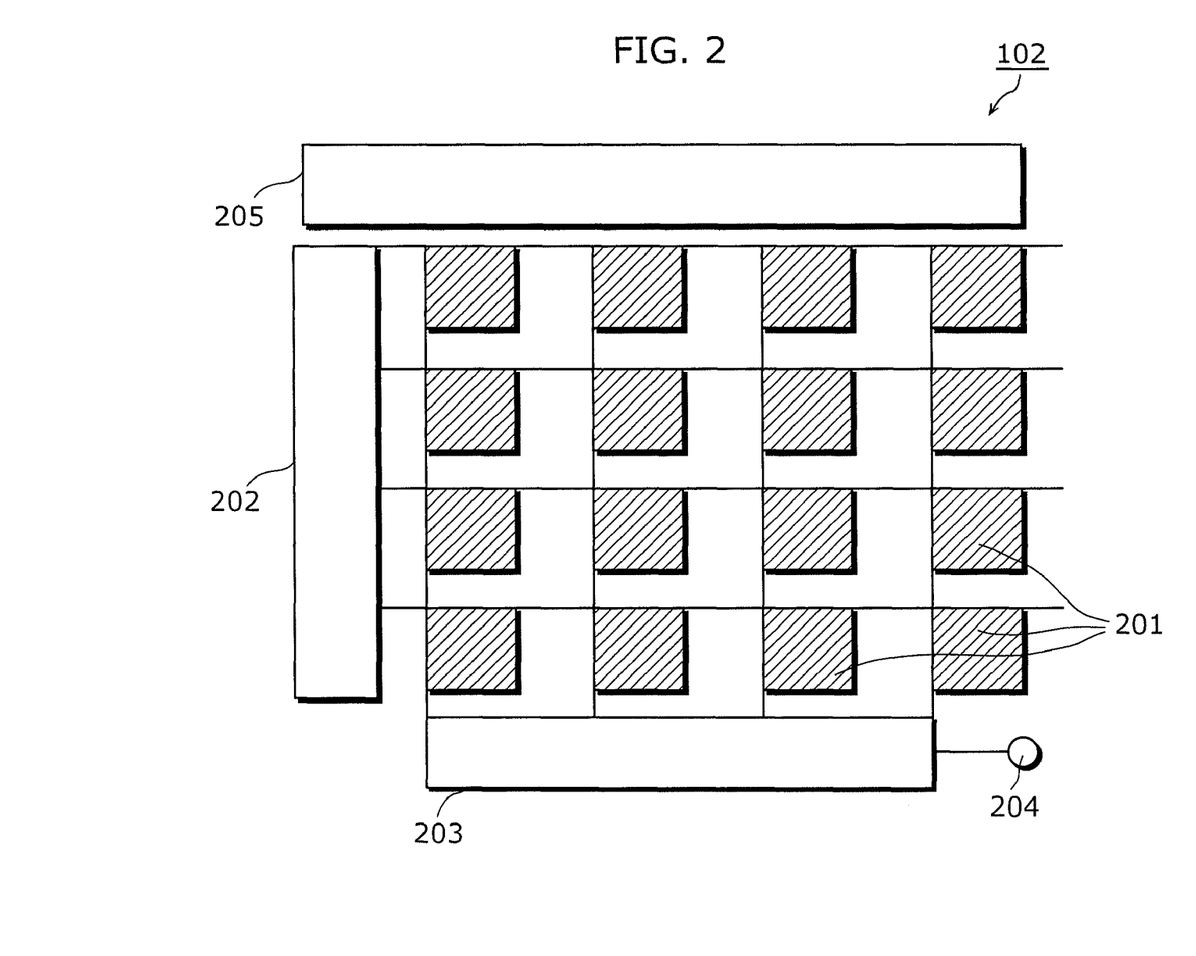
FIG. 2 is a schematic view illustrating a structure of a solid-state imaging apparatus included in the digital still camera according to an embodiment of the present invention.

Next, a structure of the solid-state imaging apparatus 102 according the present invention will be described. FIG. 2 is a schematic view illustrating a structure of a solid-state imaging apparatus 102. As illustrated in FIG. 2, the solid-state imaging apparatus 102 includes: the solid-state imaging devices 201 arranged two-dimensionally (FIG. 2 illustrates, as an example, 16 solid-state imaging devices 201); a vertical shift register 202; a horizontal shift register 203; an output amplifier 204; and a driving circuit 205. The vertical shift register 202 selects a line of the solid-state imaging devices 201 and the horizontal shift register 203 selects a to-be-read solid-state imaging device in the selected signal line, so that the output amplifier 204 outputs a color signal corresponding to each of the solid-state imaging devices 201. Note that, the driving circuit 205 drives: the vertical shift register 202; the horizontal shift register 203; and the output amplifier 204.

Figure 3:
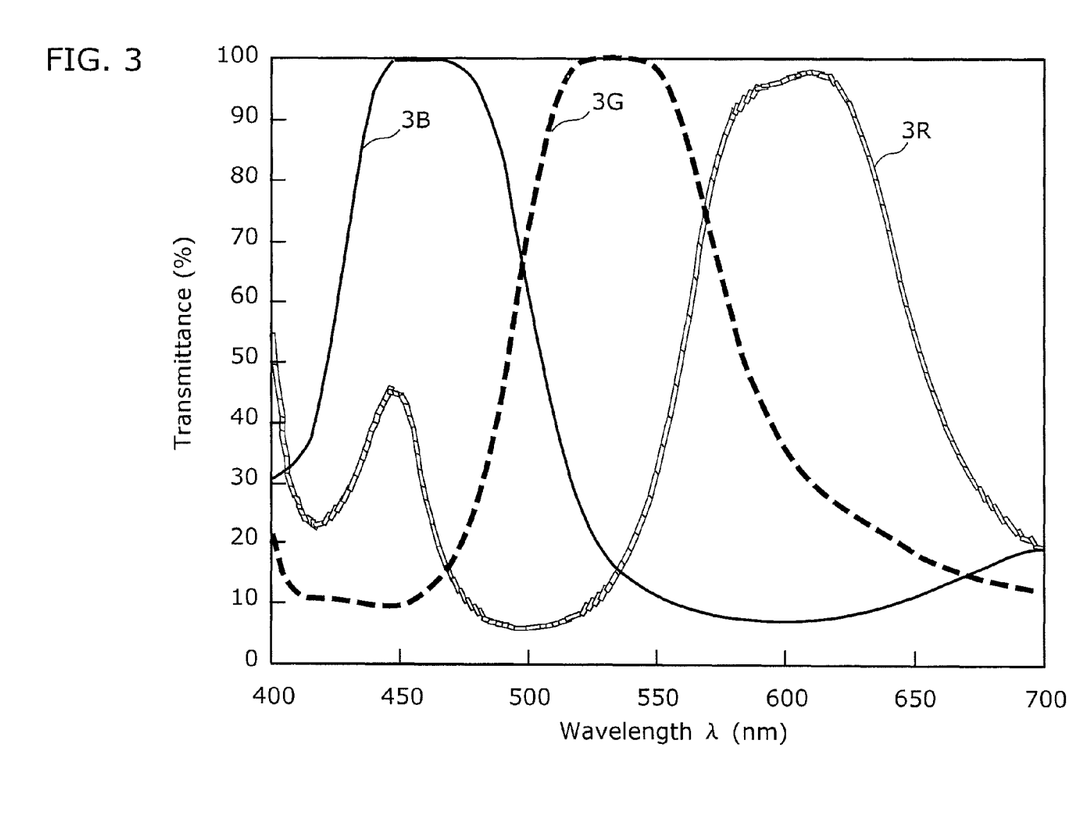
FIG. 3 illustrates a transmittance characteristic of a color filter according to a first embodiment of the present invention.
Figure 4:
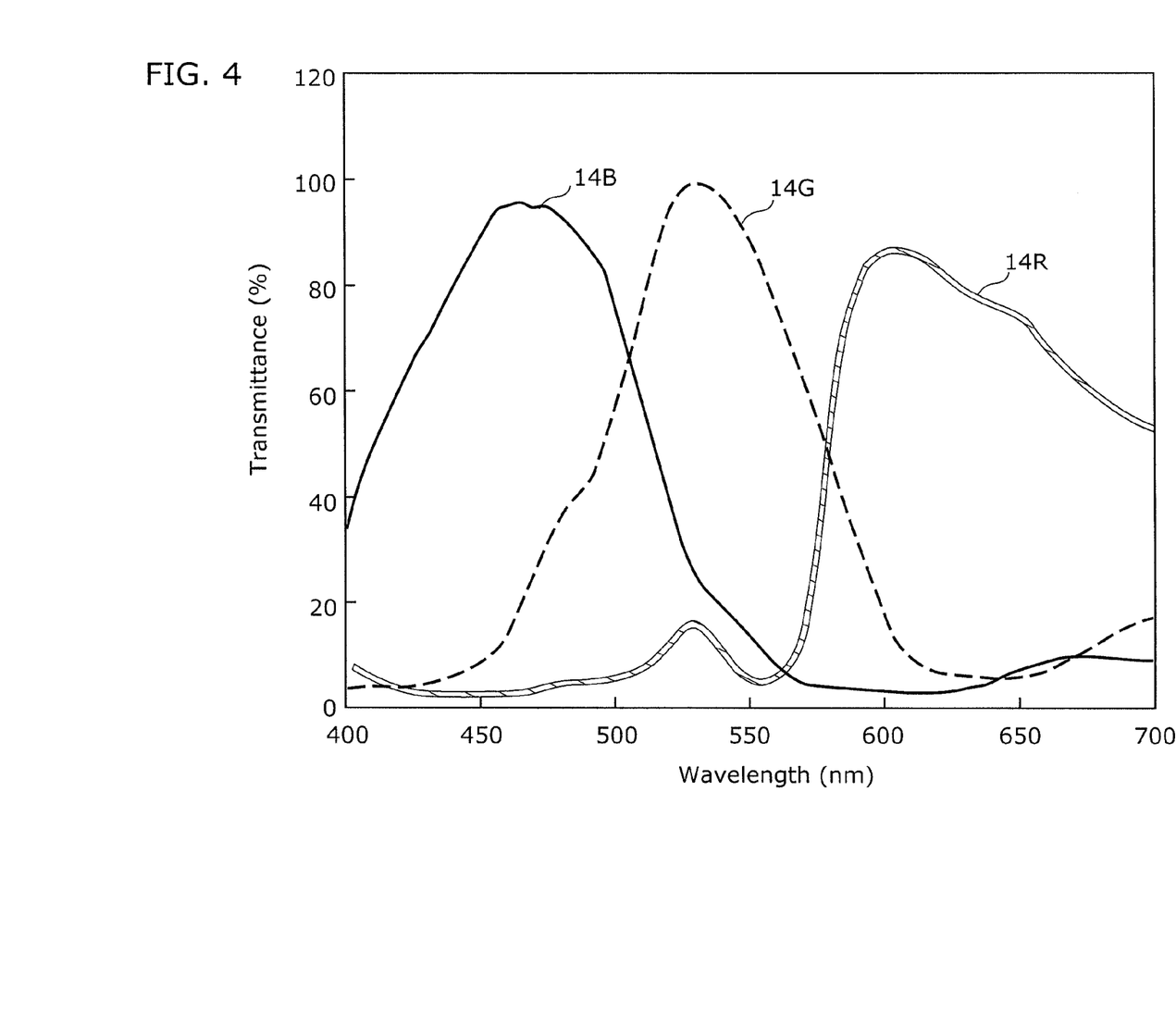
FIG. 4 illustrates a transmittance characteristic of a three-primary-color filter made of a conventional pigment.

FIG. 3 illustrates a transmittance characteristic of the color filter according to this embodiment. FIG. 3 illustrates a red filter characteristic 3R, a green filter characteristic 3G, and a blue filter characteristic 3B. Further, a transmittance characteristic of a conventional RGB three-primary-color filter is illustrated for comparison in FIG. 4. FIG. 4 illustrates a red filter characteristic 14R, a green filter characteristic 14G, and a blue filter characteristic 14B of the conventional RGB color filter. Comparison between FIG. 3 and FIG. 4 shows a significant difference in the transmittance of the red filters.

Figure 5:
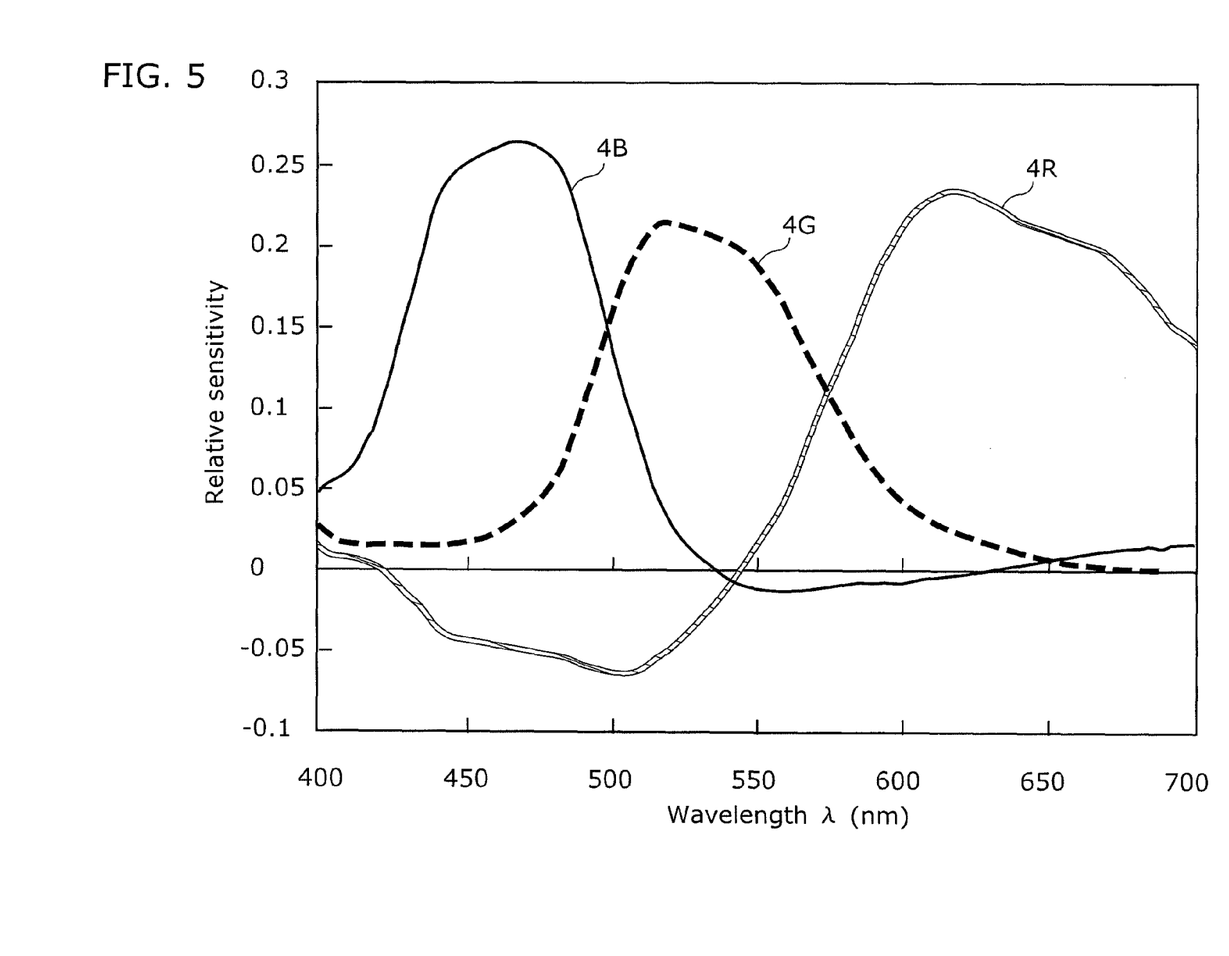
FIG. 5 illustrates a relative sensitivity of a color filter according to the first embodiment.
Figure 6:
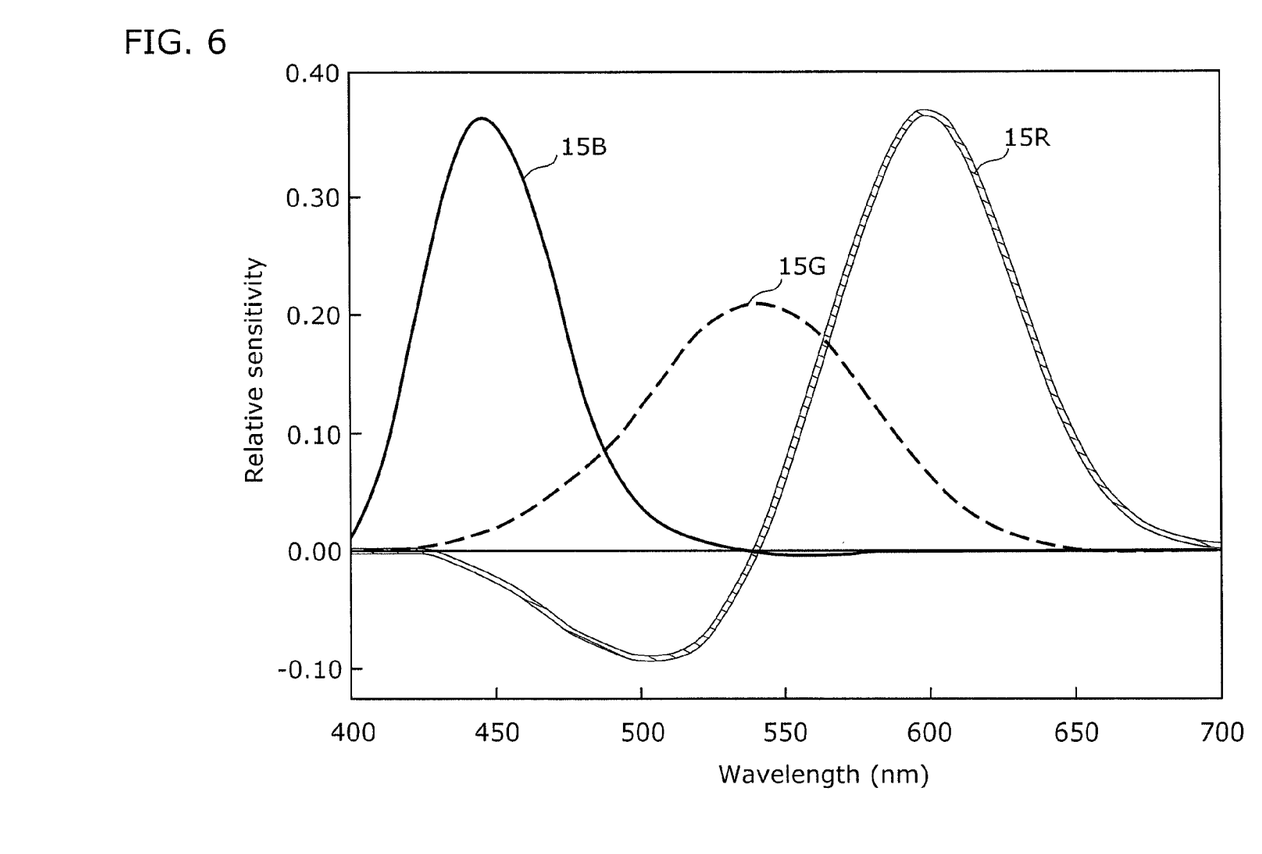
FIG. 6 illustrates a visual sensitivity characteristic (color matching function) of a human optic nerve.

As illustrated in FIG. 3, the red filter characteristic 3R has a small transmittance peak around 450 nm wavelength. FIG. 5 is a chart illustrating a relative sensitivity obtained by linearly transforming the filter characteristic and then plotting the linearly-transformed filter characteristic. FIG. 6 illustrates a characteristic showing a relative sensitivity of the human optic nerve (color matching function). FIG. 6 illustrates that, as a characteristic of the human eye, the optic nerve which senses red includes a negative sensitivity of red which has a characteristic to subtract the light whose center wavelength is around 500 nm from red component. Accordingly, whereas a conventional simple three-primary-color filter as illustrated in FIG. 4 cannot reproduce a color to match the color that the human eye senses, a color filter that has the transmittance characteristic as illustrated in FIG. 5 can implement color reproduction approaching to that of human eyes; that is, an implementation of natural color reproduction.

Figure 7:
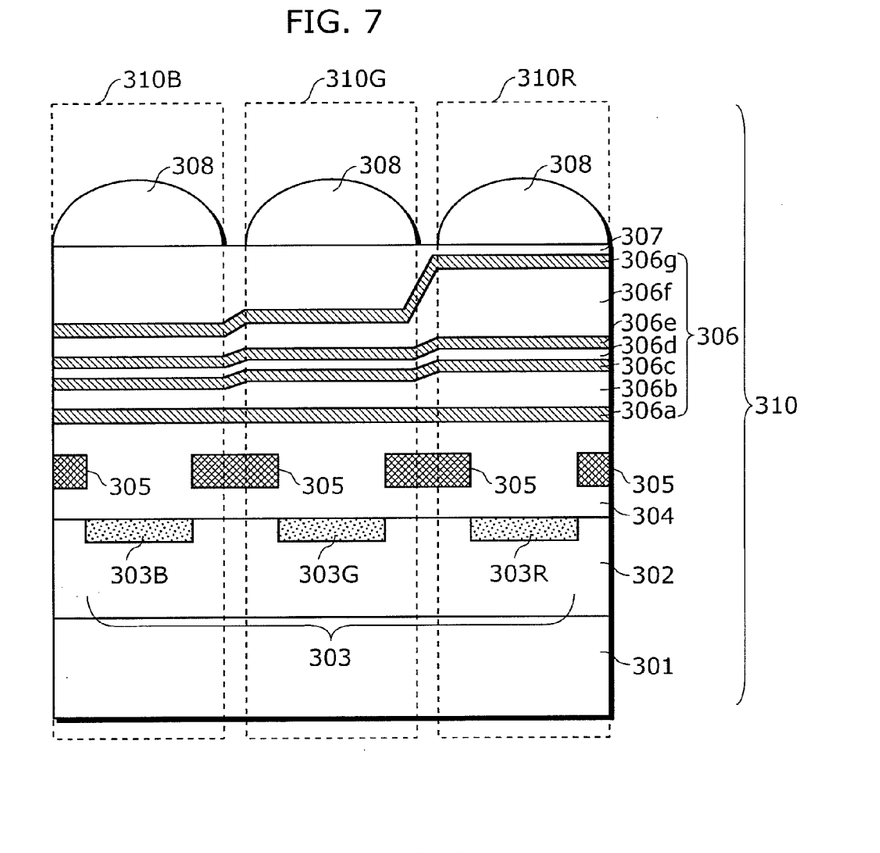
FIG. 7 is a sectional view of a device structure according to the first embodiment.
Figure 8:
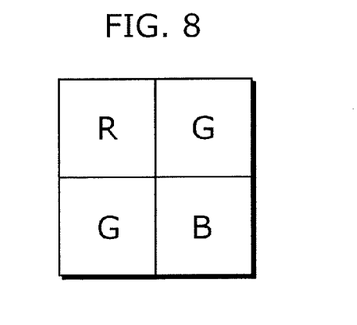
FIG. 8 illustrates a pixel arrangement based on the Bayer arrangement according to the first embodiment.

FIG. 7 is a configuration diagram (sectional view) of the solid-state imaging device 310 that includes a color filter 306 which has the transmittance characteristic as illustrated in FIG. 5 as described above. Although three types of the solid-state imaging devices, 310R, 310G, and 310B are illustrated in parallel for descriptive purposes, the solid-state imaging devices in practice are arranged according to the Bayer arrangement (arrangement of two pixels in length and width as illustrated in FIG. 8). Note that, the solid-state imaging devices 310R, 310G, and 310B are collectively called as the solid-state imaging device 310 (the same applies to a solid-state imaging device 710 described below).

As illustrated in FIG. 7, each of the solid-state imaging devices 310R, 310G, and 310B includes: an N-type semiconductor substrate 301; a P-type semiconductor layer 302; a light receiving element 303; an insulation layer 304; a light-shield film 305; a color filter 306; an insulation layer 307; and a microlens 308. Note that, the solid-state imaging devices 310R, 310G, and 310B include the light receiving elements 303R, 303G, and 303B, respectively.

In the solid-state imaging device 310, the P-type semiconductor layer 302 is formed on the N-type semiconductor substrate 301. Further, the light receiving elements 303R, 303G, and 303B (hereinafter also referred to as "light receiving element 303") are photodiodes (photoelectric conversion element) formed by ion implantation of an N-type impurity into the P-type semiconductor layer 302, and have contact with the insulation layer 304. Furthermore, the light receiving element 303 is separated by isolation regions included in the P-type semiconductor layer 302. Further, the light-shield film 305 is formed in the insulation layer 304. Further, the color filter 306 is formed on the insulation layer 304. Note that, the color filter 306 includes: a red-transmission filter that transmits red light; a green-transmission filter that transmits green light; and a blue-transmission filter that transmits blue light. Note that, the transmittance characteristic of each of the red-transmission filter, the green-transmission filter, and the blue-transmission filter is illustrated in FIG. 3.

The color filter 306 includes light transmission layers 306a to 306g. The light transmission layers 306a, 306c, 306e and 306g are made of titanium dioxide ($TiO_2$) that is a high refractive index material. The light transmission layers 306b, 306d, and 306f included in the color filter 306 are made of silicon dioxide ($SiO_2$) that is a low refractive index material. More specifically, in order to implement the transmittance characteristic as above-illustrated FIG. 3, each of the light transmission layers 306a, 306c, 306e, and 306g has a thickness of 52 nm, and the light transmission layer 306d has a thickness of 91 nm. Further, the thickness of the light transmission layer 306b differs between the blue-transmission filter, the green-transmission filter, and the red-transmission filter, respectively being 140 nm, 185 nm, and 230 nm. Similarly, the thickness of the light transmission layer 306f includes 140 nm, 185 nm, and 440 nm for the blue-transmission filter, the green-transmission filter, and the red-transmission filter, respectively. Furthermore, the light transmission layers 306c and 306e made of the titanium dioxide that is the high refractive index material and the light transmission layer 306d made of the silicon dioxide that is the low refractive index material form a group of dielectric layers. The group of dielectric layers is common in the color filter 306. Furthermore, the light transmission layers 306b and 306f made of the silicon dioxide that is the low refractive index material form a defect layer (also referred to as "spacer layer" or "resonance layer") with the group of dielectric layers being disposed therebetween. The light transmission layer 306b and the light transmission layer 306f are different in the thickness only in the red-transmission filter.

Note that an error of approximately 10 percent or less in the thickness of each layer does not have much influence on the light transmittance characteristic, and the influence can be addressed by the conventional color compensation during signal processing of a subsequent stage.

Further, the insulation layer 307 is formed on the color filter 306 for planarization. The insulation layer 307 is made of a light-transmittable dielectric material. The microlens 308 is mounted, for each unit pixel, on the planarized insulation layer 307. Note that, a light incident on the microlens 308 is collected in the light receiving element 303.

Figure 9:
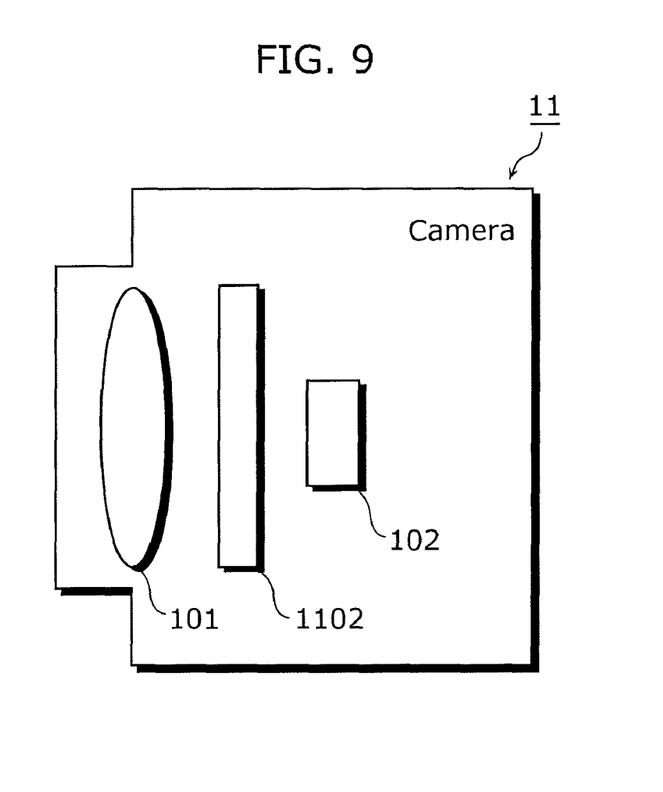
FIG. 9 illustrates a structure of a camera which is provided with an IR cut filter according to the first embodiment.

Another example of a camera that includes the above-described solid-state imaging device 310 is illustrated in FIG. 9. In FIG. 9, only main components including a lens 101, an IR cut filter 1102, and a solid-state imaging apparatus 102 are illustrated, and description for other components are omitted. The IR cut filter 1102 disposed to face an imaging area of the solid-state imaging apparatus 102 makes it possible to reflect or absorb a near-infrared component included in an incident light. With this, it is possible for a solid-state imaging device to receive lights only in a visible light range regardless of what transmittance characteristic a color filter superimposed in each solid-state imaging device of the solid-state imaging apparatus 102 has for a wavelength of a near-infrared range.

As described above, the use of the color filter that includes the transmittance characteristic as illustrated in FIG. 3 makes possible a camera and the like that can reproduce color that is natural just as the human eye senses.

Second Embodiment

Figure 10:
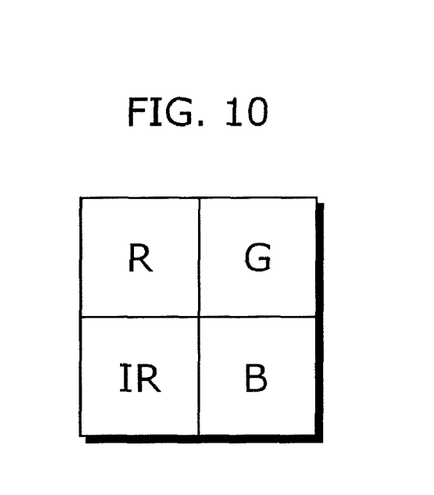
FIG. 10 illustrates an arrangement of pixels including RGB pixels and a near-infrared pixel (IR pixel) according to a second embodiment of the present invention.

In the present embodiment, descriptions will be given to a solid-state imaging apparatus which includes RG(IR)B pixels in which one of G pixels of the Bayer arrangement is replaced by an IR pixel that transmits a near-infrared light as illustrated in FIG. 10, whereas the solid-state imaging apparatus which includes RGGB pixels has been described in the above-mentioned embodiment 1. Note that a color filter according to the present embodiment enables filtering substantially approaching to the human visual sensitivity characteristic (FIG. 6).

Figure 11:
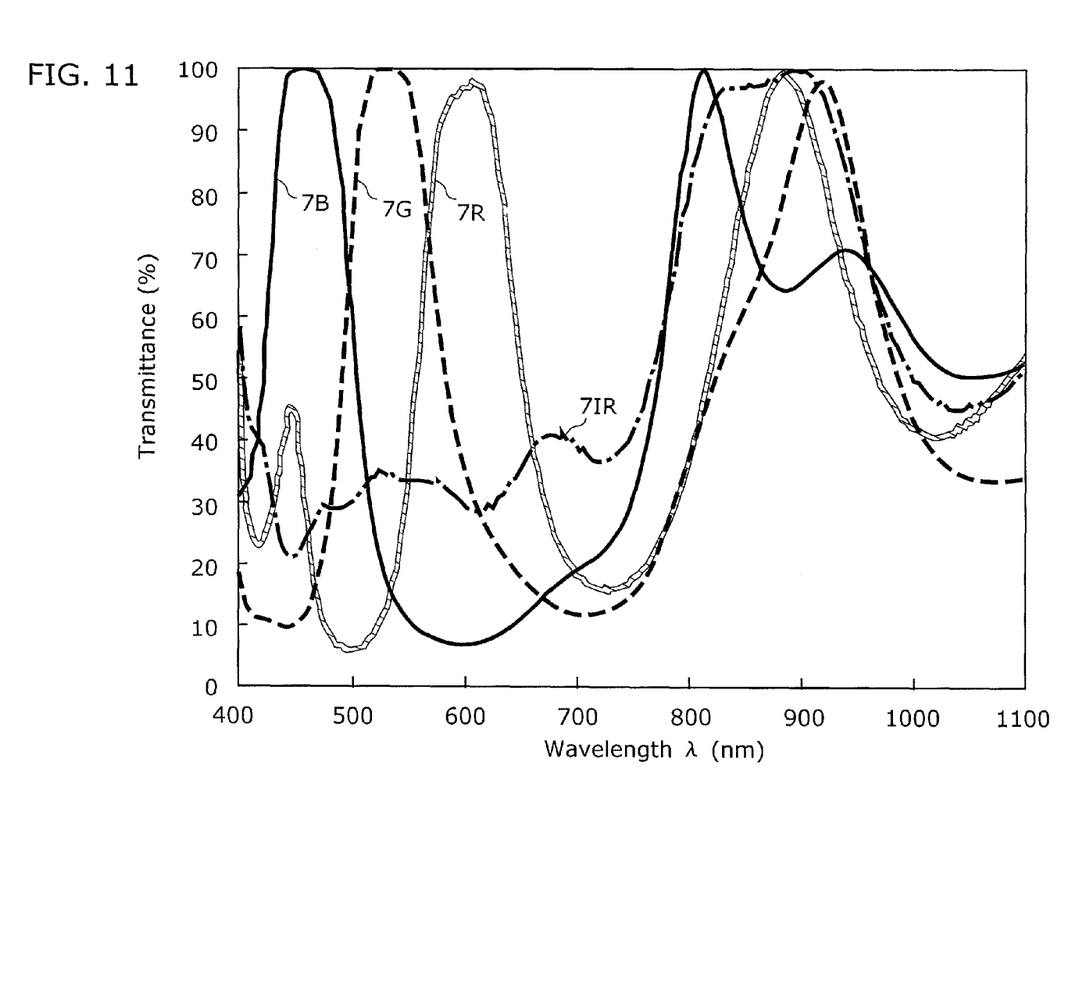
FIG. 11 illustrates a transmittance characteristic of a color filter according to the second embodiment.

FIG. 11 illustrates a transmittance characteristic of the color filter according to the present embodiment. The transmittance characteristic illustrated in FIG. 11 differs from that illustrated in FIG. 3 of the above-described first embodiment, in that: the transmittance characteristic of the IR pixel, that is, a characteristic 7IR, is included; and the wavelength range in FIG. 11 is expanded to a near-infrared range (around 1000 nm wavelength). The focus of this embodiment is that the transmittance of the IR pixel is approximately the same as the transmittance of a light in the near-infrared range of the RGB pixel.

This makes it possible to remove a near-infrared-light component, not by cutting off the near-infrared light as in the IR cut filter, but rather by subtracting the near-infrared-light component in a signal processing of a subsequent stage after the near-infrared light has entered a photodiode.

Figure 12:
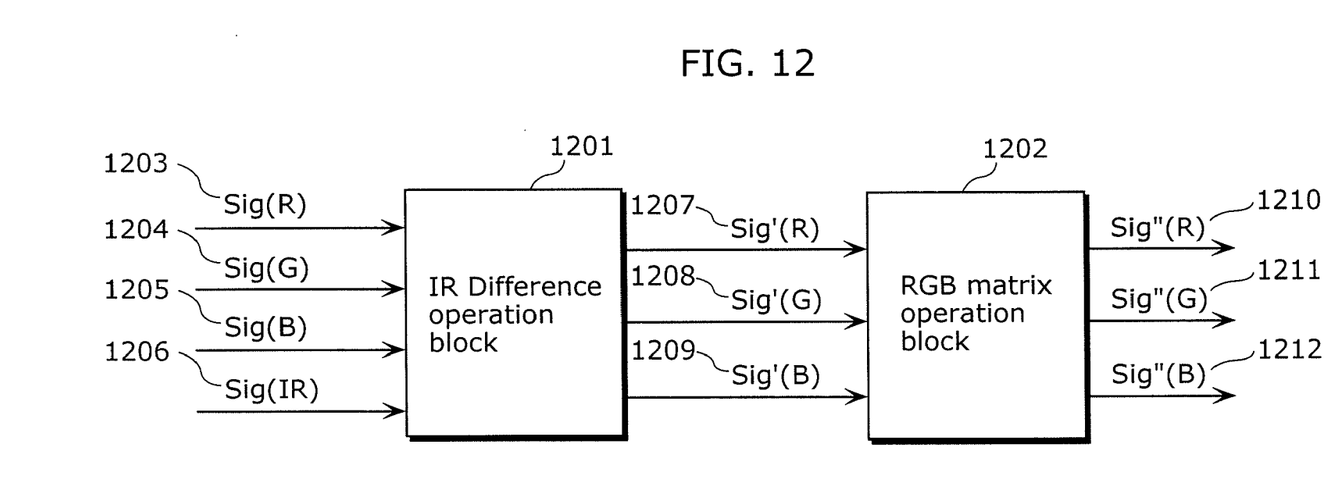
FIG. 12 is a block diagram illustrating a process of a signal processing method according to the second embodiment.
Figure 13:
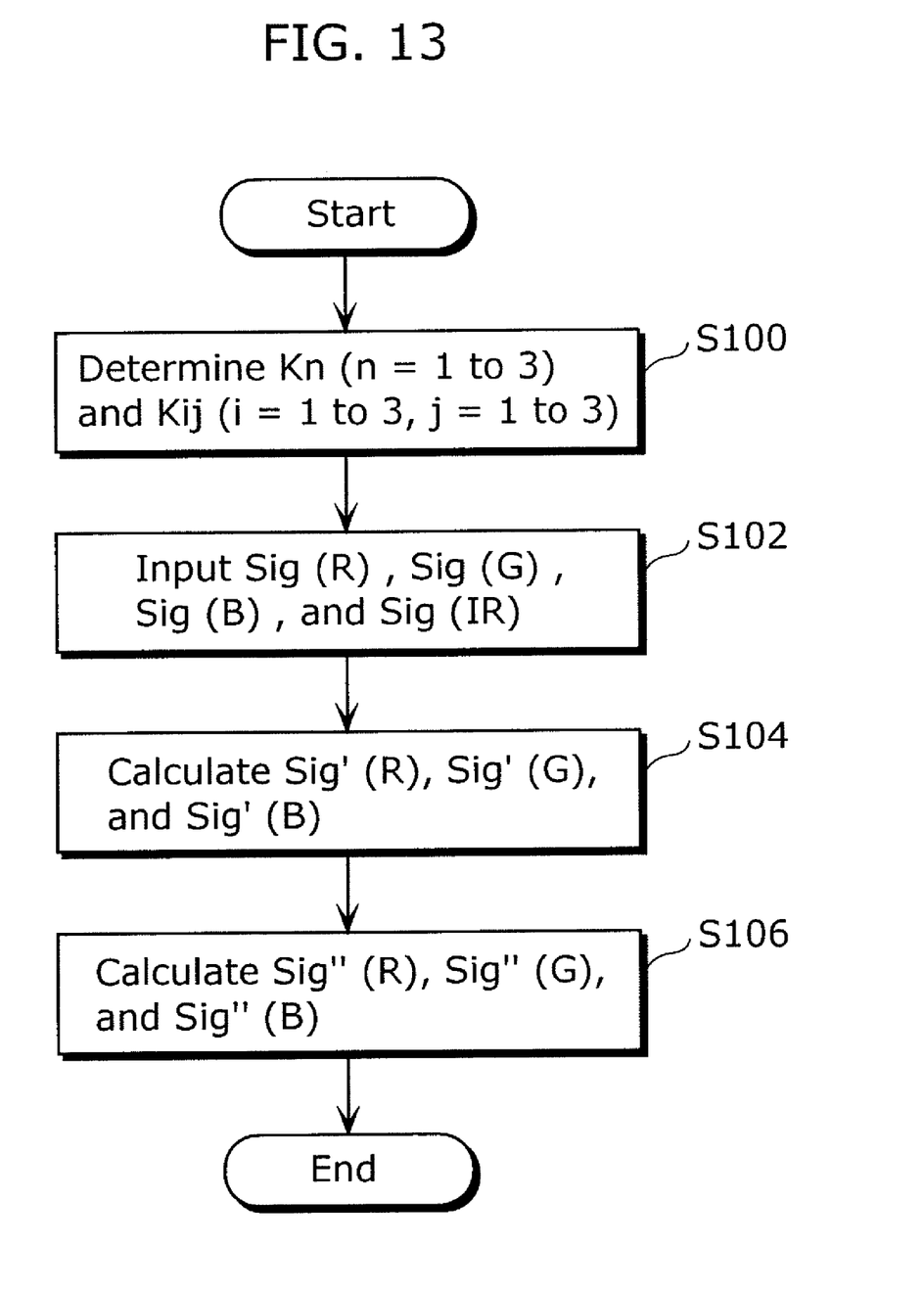
FIG. 13 is a flow chart illustrating a process of the signal processing according to the second embodiment.

Next, a signal processing method according to the present embodiment will be described with reference to FIG. 12 and FIG. 13. FIG. 12 is a block diagram illustrating a process of the signal processing method according to the present embodiment. Further, FIG. 13 is a flow chart illustrating the processes of the signal processing according to the present embodiment.

In FIG. 12, an IR difference operation block 1201 removes an IR signal component from each of the inputted RGB signals. Further, an RGB matrix operation block 1202 performs color adjustment using signals outputted from the IR difference operation block 1201.

First, necessary coefficients, Kn (n=1 to 3) and Kij (i, j=1 to 3), are determined (S100).

Next, in the IR difference operation block 1201, signals outputted from a R pixel, a G pixel, a B pixel, and an IR pixel; that is, inputted signals of a Sig(R) 1203, a Sig(G) 1204, a Sig(B) 1205, and a Sig(IR) 1206, respectively, are obtained (S102). Then a SIG'(R) 1207, Sig'(G) 1208, and Sig'(B) 1209 are calculated using the following expressions 1 to 3 (S104).

$$\text{Sig}'(R)=\text{Sig}(R)-K1\times\text{Sig}(IR) \quad \text{(Expression 1)}$$

$$\text{Sig}'(G)=\text{Sig}(G)-K2\times\text{Sig}(IR) \quad \text{(Expression 2)}$$

$$\text{Sig}'(B)=\text{Sig}(B)-K3\times\text{Sig}(IR) \quad \text{(Expression 3)}$$

Here, K1, K2, and K3 are coefficients for processing an IR component difference determined so that an IR component is removed from the inputted signal even in the case where the transmittance characteristic of the near-infrared light is different between each of the R pixel, the G pixel, and the B pixel. A specific value example for K1, K2, and K3 is indicated below.

$$K1=0.27, K2=0.35, K3=0.75$$

Operations for color adjustment as indicated by the following expressions 4 to 6 is subsequently performed in the RGB matrix operation block 1202 using Sig'(R), Sig'(G), Sig'(B), as inputs, outputted from the IR difference operation block 1201 (S106).

$$\text{Sig}''(R)=K11\times\text{Sig}'(R)+K12\times\text{Sig}'(G)+K13\times\text{Sig}'(B) \quad \text{(Expression 4)}$$

$$\text{Sig}''(G)=K21\times\text{Sig}'(R)+K22\times\text{Sig}'(G)+K23\times\text{Sig}'(B) \quad \text{(Expression 5)}$$

$$\text{Sig}''(B)=K31\times\text{Sig}'(R)+K32\times\text{Sig}'(G)+K33\times\text{Sig}'(B) \quad \text{(Expression 6)}$$

Here, each of K11, K22, and K33 has a value equal to or larger than 0 since each of the nine coefficients K 11 to K33 has a value which is set so that the color filter characteristic can be transformed to a color matching function. Other coefficients have relatively smaller absolute values as compared to K11, K22, and K33. A specific example of above-described Kij (i, j=1 to 3) is indicated below.

$$K11=1.00, K12=-0.23, K13=-0.18$$

$$K21=-0.13, K22=1.00, K23=-0.01$$

$$K31=-0.05, K32=-0.14, K33=1.00$$

Note that, "x" represents "multiply" in the above-indicated expressions 1 to 6.

Here, in the RGB matrix operation block 1202, a conventional generally-used color processing for the three primary colors can be applied without modification. This makes it possible to utilize hardware resources and software resources produced assuming to be used with the RGB three primary colors such as Bayer arrangement.

Figure 14:
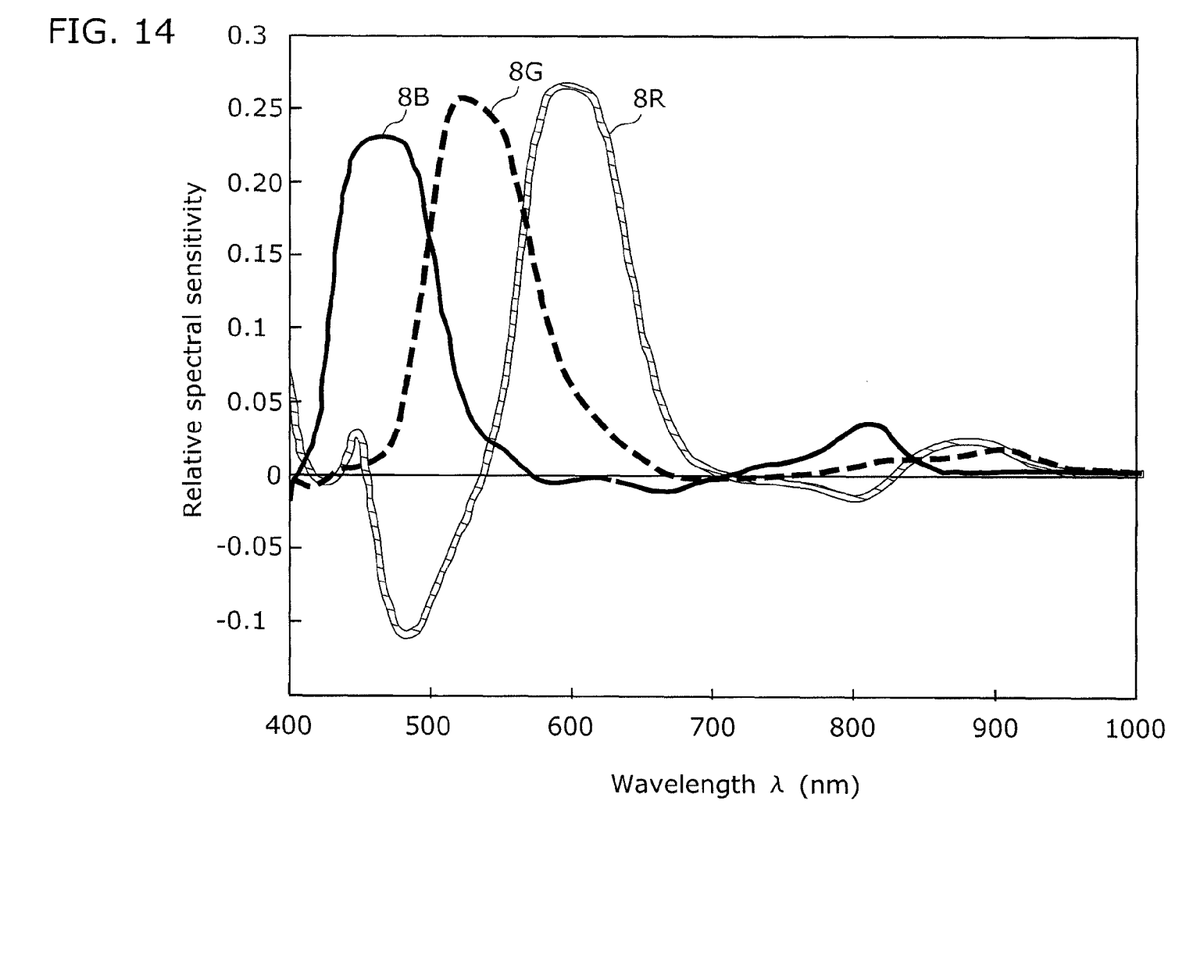
FIG. 14 illustrates a relative sensibility of the color filter according to the second embodiment.

As described above, a characteristic approaching to the color matching function, more specifically, the characteristic of which the red filter has negative sensitivity as illustrated in FIG. 14, can be obtained, as a result, by the color adjustment using 3×3 matrix operation as represented by the above expressions 4 to 6, subsequent to subtracting the IR signal component from a signal component of each of the RGB pixels.

Further, the color adjustment using a signal of the IR pixel makes possible improvement of a relative sensibility. More specifically, comparison between FIG. 14 according to the present embodiment and FIG. 5 according to the first embodiment described above proves that the transmittance characteristic of FIG. 14 is more approaching to the visual sensitivity of FIG. 6, in other words, more approaching to the human visual sensitivity, than the transmittance characteristic of FIG. 5.

Figure 15:
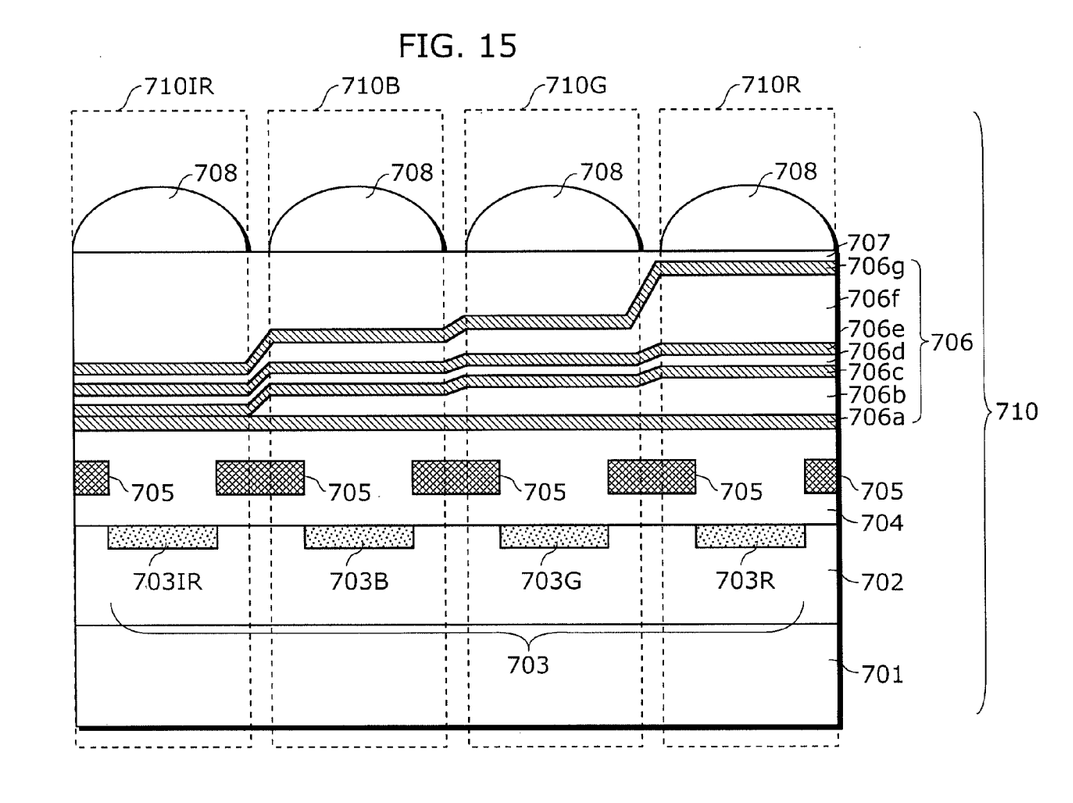
FIG. 15 is a sectional view of a device structure according to the second embodiment.

A structure of a solid-state imaging device 710 which is provided with the color filter according to the present embodiment is illustrated in FIG. 15. Descriptions for solid-state imaging devices 710B, 710G, and 710R are omitted since they are the same as the solid-state imaging devices of the first embodiment 310B, 310G, and 310R, respectively, as illustrated in FIG. 15.

The ratio of the thickness for a light transmission layer made of a low refractive index material ranges from 1:90 to 1:9 in a near-infrared light transmission filter. More specifically, a light transmission layer 706b of the solid-state imaging device 710IR has a thickness of, for example, 0 to 10 nm and a light transmission layer 706f has a thickness of, for example, 90 nm, as illustrated in FIG. 15.

The transmittance characteristic of the solid-state imaging device 710IR is indicated by the characteristic 7IR in the above-described FIG. 11.

As has been described above, the solid-state imaging device according to the present embodiment makes it possible to obtain a visible-light image with superior color reproducibility without using an IR cut filter, and to even obtain a near-infrared-light image by using near-infrared-light illumination at night.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device and the signal processing method according to the present invention can be applied to imaging devices with superior color reproduciablility, day and night vision security cameras, and in-vehicle cameras used outdoors.

What is claimed is:

1. A solid-state imaging device comprising
    a color filter including a group of dielectric layers, said color filter having high-refractive-index-material films and low-refractive-index-material films, said high-refractive-index-material films and said low-refractive-index-material films being n films and (n−1) films, respectively, which are laminated alternately, and n being an integer equal to or larger than 4, wherein said color filter includes at least a red-transmission filter, a green-transmission filter, and a blue-transmission filter, said group of dielectric layers is common to said red-transmission filter, said green-transmission filter, and said blue-transmission filter and includes two of said high-refractive-index-material films and one of said low-refractive-index-material films, the one of said low-refractive-index-material films being positioned between and in contact with the two of said high-refractive-index-material films, and in said red-transmission filter, a first one of said low-refractive-index-material films and a second one of said low-refractive-index-material films, which are not included in said group of dielectric layers, have a thickness different from each other.

2. The solid-state imaging device according to claim 1,
    wherein, in said green-transmission filter and said blue-transmission filter, the first one of said low-refractive-index-material films and the second one of said low-refractive-index-material films have a same thickness.

3. The solid-state imaging device according to claim 1,
    wherein said color filter further includes a near-infrared light transmission filter in which a ratio between a thickness of the first one of said low-refractive-index-material films and a thickness of the second one of said low-refractive-index-material films ranges from 1:90 to 1:9.

4. A camera comprising a solid-state imaging apparatus that includes a solid-state imaging device arranged two-dimensionally,
    wherein said solid-state imaging device includes
    a color filter having a group of dielectric layers, said color filter having high-refractive-index-material films and low-refractive-index-material films, said high-refractive-index-material films and said low-refractive-index-material films being n films and (n−1) films, respectively, which are laminated alternately, and n being an integer equal to or larger than 4, wherein said color filter includes at least a red-transmission filter, a green-transmission filter, and a blue-transmission filter, said group of dielectric layers is common to said red-transmission filter, said green-transmission filter, and said blue-transmission filter and includes two of said high-refractive-index-material films and one of said low-refractive-index-material films, the one of said low-refractive-index-material films being positioned between and in contact with the two of said high-refractive-index-material films, and in said red-transmission filter, a first one of said low-refractive-index-material films and a second one of said low-refractive-index-material films, which are not included in said group of dielectric layers, have a thickness different from each other.

5. A camera according to claim 4, further comprising
    an infrared cut filter disposed to face an imaging area of said solid-state imaging apparatus, said infrared cut filter cutting off a infrared light.

6. A signal processing method which uses a signal outputted from a solid-state imaging device,
    wherein the solid-state imaging device includes:
    light receiving elements, each of which receives one of a red light, a green light, a blue light, and a near-infrared light; and
    a color filter having a group of dielectric layers, the color filter having high-refractive-index-material films and low-refractive-index-material films, the high-refractive-index-material films and the low-refractive-index-material films being n films and (n−1) films, respectively, which are laminated alternately, and n being an integer equal to or larger than 4, the color filter including at least a red-transmission filter, a green-transmission filter, a blue-transmission filter, and a near-infrared light transmission filter, the group of dielectric layers being common to the red-transmission filter, the green-transmission filter, the blue-transmission filter, and the near-infrared light transmission filter and including two of the high-refractive-index-material films and one of the low-refractive-index-material films, the one of low-refractive-index-material films being positioned between and in contact with the two of high-refractive-index-material films, and in the red-transmission filter and the near-infrared light transmission filter, a first one of the low-refractive-index-material films and a second one of the low-refractive-index-material films are not included in the group of dielectric layers and have a thickness different from each other, said signal processing method comprising:

obtaining a red signal, a green signal, a blue signal, and a near-infrared signal respective ones of the light receiving elements;

subtracting a signal from each of the red signal, the green signal, and the blue signal, the signal being obtained by multiplying the near-infrared signal by a coefficient predetermined for each of the red signal, the green signal, and the blue signal; and performing a matrix operation using the red signal, the green signal, and the blue signal, on which said subtracting having been performed.

* * * * *